(12) United States Patent
Wright

(10) Patent No.: US 8,108,529 B1
(45) Date of Patent: Jan. 31, 2012

(54) ENCODED ACKNOWLEDGE SIGNAL FOR WIRELESS COMMUNICATION

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 622 days.

(21) Appl. No.: 12/075,633

(22) Filed: Mar. 12, 2008

Related U.S. Application Data

(60) Provisional application No. 60/906,605, filed on Mar. 12, 2007.

(51) Int. Cl.
*G06F 15/16* (2006.01)

(52) U.S. Cl. ............ 709/227; 709/224; 710/14; 710/17; 713/323

(58) Field of Classification Search .................. None
See application file for complete search history.

(56) References Cited

U.S. PATENT DOCUMENTS

| | | | | |
|---|---|---|---|---|
| 5,925,110 | A  * | 7/1999  | Klein ............................... | 710/15 |
| 6,182,163 | B1 * | 1/2001  | Yamashita et al. ............ | 709/238 |
| 6,195,712 | B1 * | 2/2001  | Pawlowski et al. ............ | 710/19 |
| 6,330,231 | B1 * | 12/2001 | Bi ................................ | 370/328 |
| 6,509,845 | B1 * | 1/2003  | Tanaka ............................ | 341/22 |
| 6,924,790 | B1 * | 8/2005  | Bi ................................ | 345/179 |
| 7,089,434 | B2 * | 8/2006  | Kuo ............................... | 713/300 |
| 7,392,409 | B2 * | 6/2008  | Tateyama ....................... | 713/310 |
| 7,415,624 | B2 * | 8/2008  | Miller et al. ................... | 709/230 |
| 7,626,576 | B2 * | 12/2009 | Anandakumar et al. ....... | 345/173 |
| 7,672,258 | B1 * | 3/2010  | Wu et al. ........................ | 370/311 |
| 7,710,939 | B2 * | 5/2010  | Shao et al. ..................... | 370/349 |
| 7,739,529 | B2 * | 6/2010  | Hardman et al. .............. | 713/320 |
| 7,844,308 | B2 * | 11/2010 | Rhee et al. ..................... | 455/574 |
| 2004/0029621 | A1 * | 2/2004 | Karaoguz et al. .............. | 455/574 |
| 2006/0035590 | A1 * | 2/2006 | Morris et al. ................. | 455/41.2 |
| 2007/0147381 | A1 * | 6/2007 | Wilhelm ........................ | 370/392 |

OTHER PUBLICATIONS

NNRD41693. "Method for Asserting Lowest Computer Power Level." IBM Research Disclosure, UK. Dec. 1998. vol. 41, Issue 416. 3 pages.*

NN9502259. "Power Management Method for Portable Personal Computer with Modem." IBM Technical Disclosure Bulletin. Feb. 1995, US. vol. 38, Issue 2. 2 pages.*

NN9010237. "Interface of a Low-Power Keyboard for Lap-Top Computers." IBM Technical Disclosure Bulletin. Oct. 1990. US. vol. 33, Issue 5. 3 pages.*

* cited by examiner

*Primary Examiner* — Jeffrey R Swearingen

(57) ABSTRACT

A method in accordance with one embodiment of the invention can include transmitting wirelessly an encoded message that comprises reconciliation data to a host system. Additionally, an acknowledge packet can be received wirelessly from the host system, wherein the acknowledge packet corresponds to the encoded message. It can be determined if reconciliation data of the acknowledge packet has been changed in a predetermined way. If the reconciliation data of the acknowledge packet has been changed in the predetermined way, a peripheral device can be caused to enter a first mode.

17 Claims, 5 Drawing Sheets

ENCODED ACKNOWLEDGE SIGNAL FOR WIRELESS COMMUNICATION

CROSS-REFERENCE TO RELATED APPLICATIONS

This patent application claims the benefit of the co-pending U.S. Provisional Patent Application No. 60/906,605 entitled "Programmable Intelligent Integrated Circuits", by David Wright et al., filed Mar. 12, 2007, which is hereby incorporated by reference.

BACKGROUND

Conventional wireless peripheral communication protocol, e.g., between a keyboard and a host computer system, is weighted more heavily on the host system (also called the "receiver"). That is to say, the peripheral device (also called the "transmitter") does not have many responsibilities in order to reduce its power consumption since usually the peripheral device is battery powered. Furthermore, when the peripheral device is not performing its responsibilities, it typically reverts to a low power state or sleep mode. It is noted that many peripherals now offer displays, wherein the host system typically transmit information to the peripheral for display.

One of the problems with this system is enabling the host system to signal the peripheral that information or data is available for receipt while the peripheral is in a sleep mode. One solution has the peripheral periodically polling the host system for data, but this consumes too much power. Also, this solution introduces a new command (header) into the wireless peripheral communication protocol. Currently, the number of commands used provides good Hamming Distance between the nodes of the spread spectrum communication and this offers good noise rejection. However, introduction of a new command may lead to decreased noise rejection. Also, another disadvantage of this solution is that it is not backwards compatible with existing peripherals.

As such, it is desirable to address one or more of the above issues.

SUMMARY

A method in accordance with one embodiment of the invention can include transmitting wirelessly an encoded message that comprises reconciliation data to a host system. Additionally, an acknowledge packet can be received wirelessly from the host system, wherein the acknowledge packet corresponds to the encoded message. It can be determined if reconciliation data of the acknowledge packet has been changed in a predetermined way. If the reconciliation data of the acknowledge packet has been changed in the predetermined way, a peripheral device can be caused to enter a first mode.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "transmitting", "receiving", "determining", "causing", "changing", "switching", "storing", "executing", "setting", "programming", "utilizing", "resuming", "producing", "completing", "outputting", or the like, can refer to the actions and processes of a processor(s) and/or electrical components, an electronic and/or electrical computing device, but is not limited to such. The computing device can manipulate and transform data represented as physical (electronic) quantities within the computing device's registers and/or memories into other data similarly represented as physical quantities within the computing device memories and/or registers or other such information storage or transmission.

Figure 1:
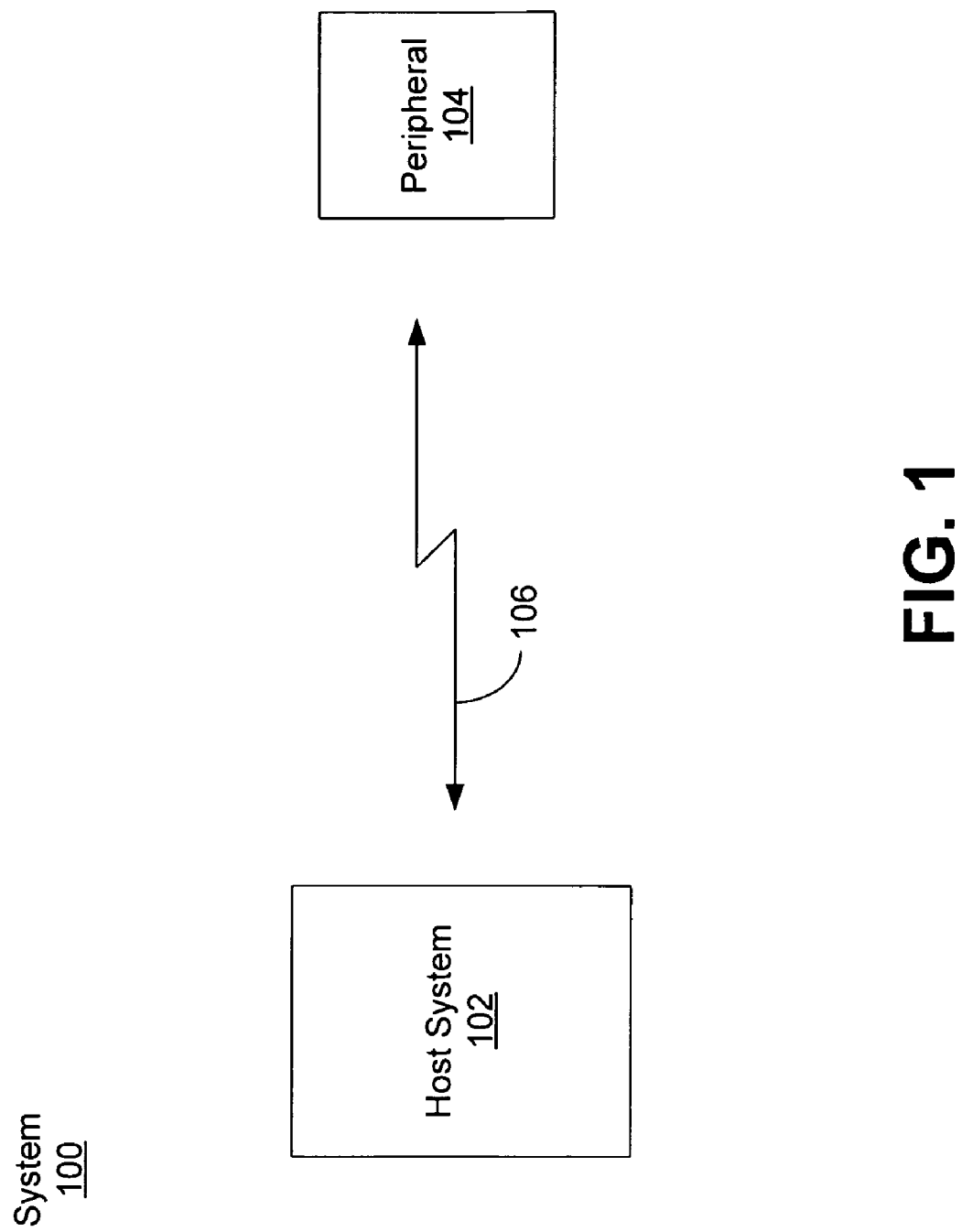
FIG. 1 is a block diagram of an exemplary system in accordance with various embodiments of the invention.

FIG. 1 is a block diagram of an exemplary system 100 in accordance with various embodiments of the invention. Specifically, the system 100 enables a host system (or receiver) 102 to communicate via a wireless communication protocol 106 to a peripheral device (or transmitter) 104 that it has data to communicate to the peripheral 104. It is noted that in various embodiments, the system 100 is backward compatible with existing wireless communication protocols and does not increase the power consumption of the peripheral device 104 compared with conventional techniques. Furthermore, the system 100 does not require complex circuitry and offers good noise rejection between the communication nodes 102 and 104.

Within system 100, it is pointed out that the host system 102 can be implemented in a wide variety of ways. For example, the host system 102 can be implemented as, but is not limited to, a computer system, a set-top box, a television, a computing device, a portable computing device, and the like. Additionally, it is noted that the peripheral device 104 can be implemented in a wide variety of ways. For instance, the peripheral device or apparatus 104 can be implemented as, but is not limited to, a wireless keyboard, a wireless remote control, a wireless computer mouse (e.g., cursor directing device), and the like. Moreover, note that the wireless communication protocol 106 can be implemented in a wide variety of ways. For example, the wireless communication protocol 106 can be implemented with, but is not limited to, any infrared (IR) communication protocol, any radio frequency (RF) communication protocol, and the like. It is noted that in one embodiment, the host system 102 can wirelessly transmit data to and wirelessly receive data from the peripheral device 104. Furthermore, in an embodiment, the peripheral device 104 can wirelessly transmit data to and wirelessly receive data from the host system 102. As such, the host system 102 and the peripheral device 104 can communicate wirelessly.

Within FIG. 1, the system 100 can operate in a wide variety of ways. For example in one embodiment, the peripheral 104 can be implemented as a wireless keyboard. As such, when a key or button of peripheral 104 is pressed, the peripheral 104 can wake up from a sleep mode and transmit an encoded message (or communication packet) that indicates the pressed key to the host 102 via the wireless communication protocol 106. It is noted that the encoded message can be implemented in a wide variety of ways. For example, the encoded message can include reconciliation data, which the host system 102 can subsequently use to acknowledge receipt of the encoded message to the peripheral 104. In one embodiment, reconciliation data is any information encoded in any way in the acknowledge packet that is used by the recipient of the acknowledge packet to match that acknowledge packet with a previously transmitted data packet. In an embodiment, reconciliation data may also be defined as any information encoded in any way in the data packet that is included in an acknowledge packet in order enable the transmitter of the data packet to match a received acknowledge packet with a specific previously transmitted data packet. The reconciliation data can be implemented in a wide variety of ways. For example, the reconciliation data can be implemented as, but is not limited to, a cyclic redundancy check (CRC), a checksum, a sequence number, the node identification (ID) of the peripheral 104, the node ID of the host system 102, and the like.

Upon receipt of the encoded message that includes the reconciliation data, the host system 102 can determine whether it has any data (or information or messages) to transmit to the peripheral 104. If not, the host system 102 can transmit via the wireless communication protocol 106 an acknowledge (ACK) packet to the peripheral 104 in receive mode, which notifies the peripheral device 104 that the host system 102 successfully received the encoded message. Note that in an embodiment, the acknowledge packet includes the same reconciliation data that was included within the encoded message originally transmitted by the peripheral 104. In this fashion, the peripheral device 104 is able to know that the received acknowledge packet corresponds with the transmitted encoded message. After receiving the acknowledge packet, the peripheral 104 can enter a sleep mode or low power state. In this manner, the peripheral 104 is able to minimize its power consumption.

However, in FIG. 1, if the host system 102 has any data (or information or messages) to transmit to the peripheral device 104, the host system 102 can change or modify the received reconciliation data in a predetermined way. Note that the changing of the received reconciliation data in a predetermined way can be implemented in a wide variety of ways. For example, the predetermined modification can include, but is not limited to, inverting the reconciliation data of the encoded message, performing one or more logical operations (e.g., AND, OR, NAND, NOR, XOR, XNOR) with the reconciliation data of the encoded message and a copy of the reconciliation data, performing one or more logical operations (e.g., AND, OR, NAND, NOR, XOR, XNOR) with a random value and the reconciliation data of the encoded message, performing one or more logical operations (e.g., AND, OR, NAND, NOR, XOR, XNOR) with a static value and the reconciliation data of the encoded message, and the like. The host system 102 can then include the changed or modified reconciliation data within an acknowledge packet that it transmits to the peripheral 104 via the wireless communication protocol 106. Upon reception of the acknowledge packet, the peripheral device 104 is able to recognize (or detect) that the received reconciliation data has been changed in a predetermined way. As such, rather than entering sleep mode, the peripheral device 104 would remain in receive mode for a predefined period of time in order to receive any data packets from the host system 102. In this manner, the host system 102 is able to notify the peripheral device 104 that it has data (or information or a message) to transmit to peripheral device 104. One of the advantages of this method in accordance with the invention is that it does not add another header code to the wireless communication protocol utilized by system 100. Note that in one embodiment, the peripheral 104 can include simple circuitry to detect if proper reconciliation data or its predetermined modified version was received in the acknowledge packet.

In one embodiment, the peripheral device 104 can include some type of display and/or any number of status indicators. Furthermore, the display and/or the one or more status indicators may be remotely changed by the host system 102, independently of the activity of the peripheral device 104. In order to accomplish this, the host system 102 can signal or notify the peripheral device 104 (as described herein) that it has data or information to transmit to the peripheral device 104.

Within FIG. 1, it is understood that the system 100 may not include all of the elements illustrated by FIG. 1. Additionally, the system 100 can be implemented to include one or more elements not illustrated by FIG. 1.

Figure 2:
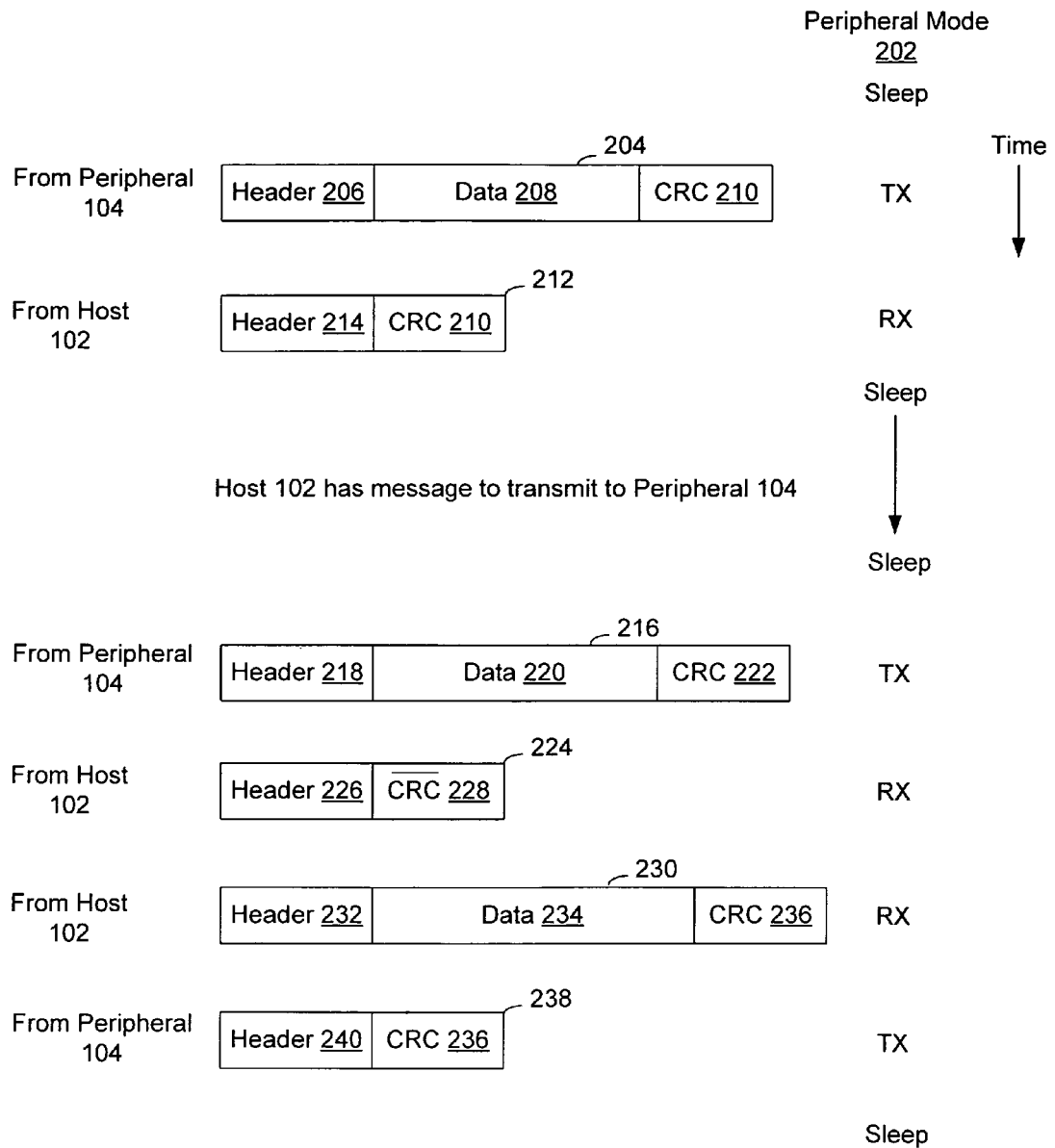
FIG. 2 is an exemplary timing diagram in accordance with various embodiments of the invention.

FIG. 2 is an exemplary timing diagram 200 in accordance with various embodiments of the invention. Note that FIGS. 1 and 2 will be discussed together in order to provide a more complete understanding of various embodiments of the invention. Within FIG. 2, at the beginning of this example, the peripheral device 104 is currently in a sleep mode (as indicated by peripheral mode column 202). In response to some event, the peripheral device 104 can awake from its sleep mode (or low power mode), change into a transmit (TX) mode, and transmit wirelessly a communication packet 204 to the host system 104 via the wireless communication protocol 106. Note that the communication packet 204 includes a header 206, data 208, and reconciliation data 210 (e.g., shown as CRC data). Next, the peripheral device 104 can change to its receive (RX) mode (as indicated by peripheral mode column 202) in order to receive wirelessly the acknowledge packet 212 transmitted by the host system 102 via the wireless communication protocol 106. The acknowledge packet 212 can include a header 214 along with the same reconciliation data 210 (e.g., shown as CRC data) that was included within the communication packet 204. In this manner, the peripheral 104 knows that the host system 102 successfully received the communication packet 204. After receiving the acknowledge packet 212, the peripheral device 104 can enter a sleep mode (as indicated by peripheral mode column 202). As time passes and while the peripheral device 104 is in its sleep mode, the host system 102 can determine that it has a message Or data or information to transmit to the peripheral device 104.

At some point in time, an event occurs that causes the peripheral device 104 to wake up from its sleep mode. After which, the peripheral device 104 changes into its transmit (TX) mode, and transmit wirelessly a communication packet 216 to the host system 104 via the wireless communication protocol 106. It is pointed out that the communication packet 216 includes a header 218, data 220, and reconciliation data 222 (e.g., shown as CRC data). Next, the peripheral device 104 can change to its receive (RX) mode (as indicated by peripheral mode column 202) in order to receive wirelessly the acknowledge packet 224 transmitted by the host system 102 via the wireless communication protocol 106. The acknowledge packet 224 can include a header 226 along with reconciliation data 228 that the host system 102 has been modified in a predetermined way (e.g., the received CRC data 222 was inverted to generate the CRC-bar data 228). Since the peripheral device 104 recognizes (or detects) the reconciliation data 228 that was modified in a predetermined way, the peripheral device 104 remains in its receive (RX) mode (as indicated by peripheral mode column 202) instead of entering its sleep mode. While in its receive mode, the peripheral device 104 receives wirelessly communication packet 230 that was transmitted by the host system 102 via the wireless communication protocol 106. The communication packet 230 can include a header 232, data 234, and reconciliation data 236 (e.g., shown as CRC data). In response, the peripheral device 104 can change into its transmit (TX) mode (as indicated by peripheral mode column 202) and transmit wirelessly an acknowledge packet 238 to the host system 102 indicating that it received the communication packet 230 correctly. The acknowledge packet 238 can include a header 240 along with the same CRC data 236 that was included within the communication packet 230. After transmitting wirelessly the acknowledge packet 238, the peripheral device 104 can enter its sleep mode (as indicated by peripheral mode column 202).

Within FIG. 2, it is pointed out that if an acknowledge packet (or handshake) is not received after a defined period of time, then the node (e.g., 102 or 104) that wirelessly transmitted the original communication packet will retransmit it. However, this has not been included within timing diagram 200 so as not to unnecessarily obscure aspects of various embodiments of the invention.

Figure 3:
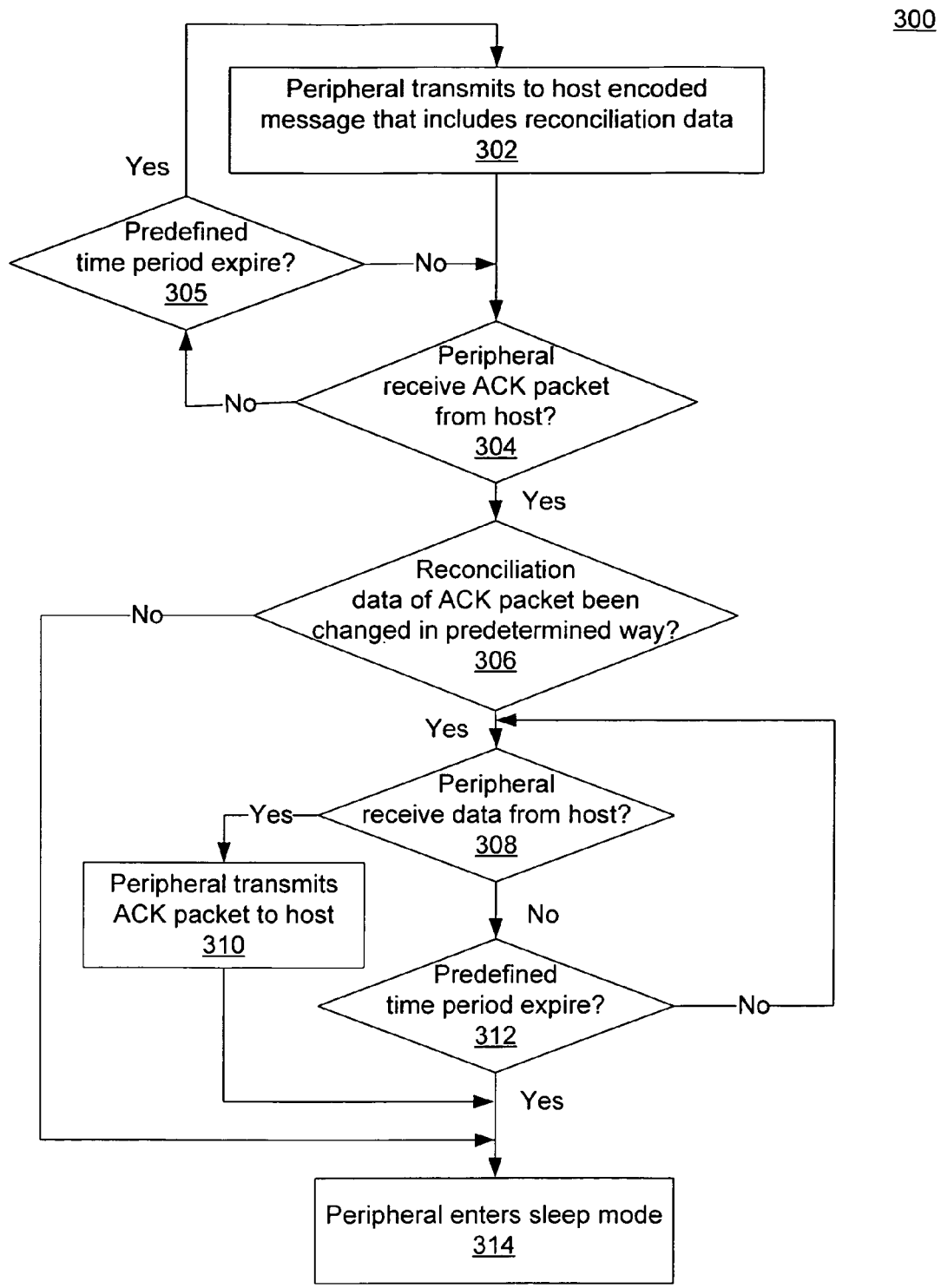
FIG. 3 is a flow diagram of an exemplary method in accordance with various embodiments of the invention.

FIG. 3 is a flow diagram of a method 300 in accordance with various embodiments of the invention for enabling an encoded acknowledge signal within a wireless communication protocol. Method 300 includes exemplary processes of various embodiments of the invention which can be carried out by a processor(s) and/or electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in or be stored by any type of computing device readable medium. Although specific operations are disclosed in method 300, such operations are exemplary. Method 300 may not include all of the operations illustrated by FIG. 3. Also, method 300 may include various other operations and/or variations of the operations shown by FIG. 3. Likewise, the sequence of the operations of method 300 can be modified. It is noted that the operations of method 300 can be performed by software, by firmware, by electronic hardware, by electrical hardware, or by any combination thereof.

Specifically, method 300 can include a peripheral device wirelessly transmitting via a wireless communication protocol to a host receiver an encoded message that includes reconciliation data. A determination can be made as to whether the peripheral device has received via the wireless communication protocol an acknowledge (ACK) packet from the host receiver. If not, a determination can be made as to whether a predefined time period has expired since the peripheral wirelessly transmitted the encoded message to the host. If not, the determination of whether the peripheral device had received an acknowledge packet can be repeated. However, if the predefined time period has expired, the peripheral device can wirelessly retransmit the encoded message to the host receiver. It is noted that if the peripheral device wirelessly receives an acknowledge packet from the host receiver, a determination can be made as to whether the reconciliation data of the received acknowledge packet has been changed in a predetermined way. If not, the peripheral device can enter a sleep mode. However, if the reconciliation data of the acknowledge packet has been changed in a predetermined way, a determination can be made as to whether the peripheral device has wirelessly received data from the host receiver via the wireless communication protocol. If so, the peripheral device can transmit wirelessly an acknowledge (ACK) packet to the host receiver via the wireless communication protocol. However, if the peripheral device has not received data from the host receiver, a determination can be made as to whether a predefined time period has expired since it was determined that the reconciliation data of the acknowledge packet had been changed in a predetermined way. If not, the determination can be repeated of whether the peripheral device has wirelessly received data from the host receiver via the wireless communication protocol. However, if it is determined that the predefined time period has expired, the peripheral device can enter a sleep mode. In this manner, an encoded acknowledge signal can be enabled within a wireless communication protocol.

At operation 302 of FIG. 3, a peripheral device (e.g., 104) can wirelessly transmit to a host (e.g., 102) an encoded message (e.g., 216) that includes reconciliation data (e.g., 222) via a wireless communication protocol (e.g., 106). Note that operation 302 can be implemented in a wide variety of ways. For example, operation 302 can be implemented in any manner similar to that described herein, but is not limited to such.

At operation 304, a determination can be made as to whether the peripheral device has wirelessly received an acknowledge (ACK) packet (e.g., 212 or 224) from the host receiver via the wireless communication protocol. If not, the process 300 can proceed to operation 305. However, if the peripheral device wirelessly receives an acknowledge packet from the host receiver at operation 304, the process 300 can proceed to operation 306. It is pointed out that operation 304 can be implemented in a wide variety of ways. For example, operation 304 can be implemented in any manner similar to that described herein, but is not limited to such.

At operation 305, a determination can be made as to whether a predefined time period has expired since the peripheral wirelessly transmitted the encoded message to the host at operation 302. If not, the process 300 can proceed to operation 304. However, if it is determined that the predefined time period has expired at operation 305, the process 300 can proceed to operation 302. It is noted that operation 305 can be implemented in a wide variety of ways. For example, operation 305 can be implemented in any manner similar to that described herein, but is not limited to such.

At operation 306 of FIG. 3, a determination can be made as to whether the reconciliation data (e.g., 210 or 228) of the received acknowledge packet has been changed in a predetermined way. If not, the process 300 can proceed to operation 314. However, if the reconciliation data of the acknowledge packet has been changed in a predetermined way at operation 306, the process 300 can proceed to operation 308. It is noted that operation 306 can be implemented in a wide variety of ways. For example, operation 306 can be implemented in any manner similar to that described herein, but is not limited to such.

At operation 308, a determination can be made as to whether the peripheral device has wirelessly received data or information or a message (e.g., 230) from the host via the wireless communication protocol. If not, the process 300 can proceed to operation 312. However, if the peripheral device has wirelessly received data from the host receiver at operation 308, the process 300 can proceed to operation 310. Note operation 308 can be implemented in a wide variety of ways. For example, operation 308 can be implemented in any manner similar to that described herein, but is not limited to such.

At operation 310 of FIG. 3, the peripheral device can wirelessly transmit an acknowledge (ACK) packet (e.g., 238) to the host receiver via the wireless communication protocol. It is pointed out that that operation 310 can be implemented in a wide variety of ways. For example, operation 310 can be implemented in any manner similar to that described herein, but is not limited to such.

At operation 312, a determination can be made as to whether a predefined time period has expired since it was determined at operation 306 that the reconciliation data of the acknowledge packet had been changed in a predetermined way. If not, the process 300 can proceed to operation 308. However, if it is determined that the predefined time period has expired at operation 312, the process 300 can proceed to operation 314. It is noted that operation 312 can be implemented in a wide variety of ways. For example, operation 312 can be implemented in any manner similar to that described herein, but is not limited to such.

At operation 314 of FIG. 3, the peripheral device can enter a sleep mode. Note that operation 314 can be implemented in a wide variety of ways. For example, operation 314 can be implemented in any manner similar to that described herein, but is not limited to such. At the completion of operation 314, process 300 can be exited.

Figure 4:
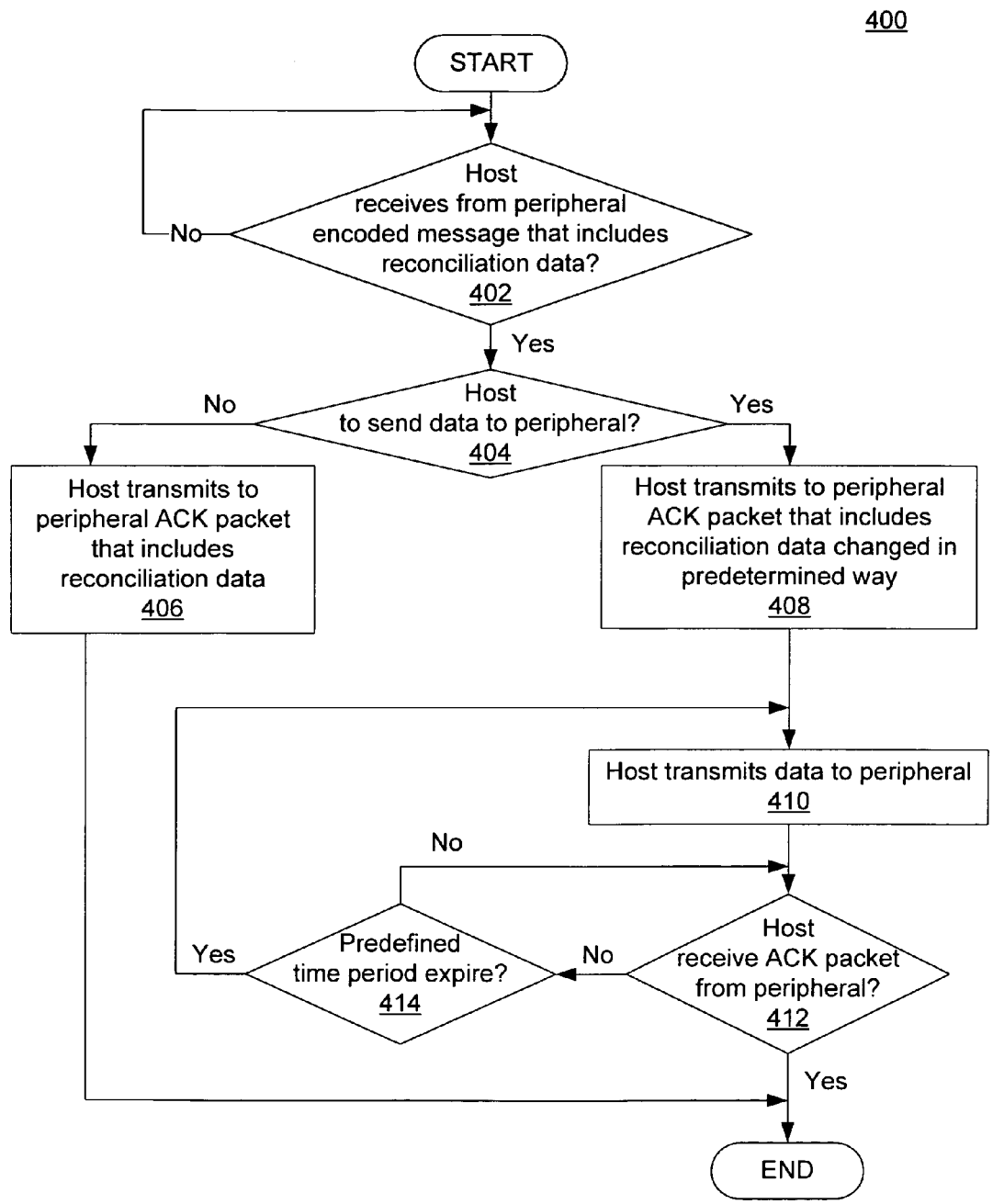
FIG. 4 is a flow diagram of another exemplary method in accordance with various embodiments of the invention.

FIG. 4 is a flow diagram of a method 400 in accordance with various embodiments of the invention for enabling an encoded acknowledge signal within a wireless communication protocol. Method 400 includes exemplary processes of various embodiments of the invention which can be carried out by a processor(s) and/or electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in or be stored by any type of computing device readable medium. Although specific operations are disclosed in method 400, such operations are exemplary. Method 400 may not include all of the operations illustrated by FIG. 4. Also, method 400 may include various other operations and/or variations of the operations shown by FIG. 4. Likewise, the sequence of the operations of method 400 can be modified. It is noted that the operations of method 400 can be performed by software, by firmware, by electronic hardware, by electrical hardware, or by any combination thereof.

Specifically, method 400 can include a determination as to whether a host receiver has wirelessly received an encoded message that includes reconciliation data from a peripheral device via a wireless communication protocol. If not, the determination can be repeated. However, if the host has wirelessly received an encoded message that includes reconciliation data from the peripheral device via the wireless communication protocol, a determination can be made as to whether the host is to send data or information or a message to the peripheral device via the wireless communication protocol. If not, the host can transmit wirelessly to the peripheral an acknowledge (ACK) packet that includes the received reconciliation data via the wireless communication protocol. However, if it is determined that the host is to send data or information to the peripheral device, the host can transmit wirelessly to the peripheral via the wireless communication protocol an acknowledge packet that includes the received reconciliation data changed in predetermined way. The host can transmit wirelessly the data or information to the peripheral via the wireless communication protocol. A determination can be made as to whether the host has received wirelessly an acknowledge packet from the peripheral via the wireless communication protocol that corresponds to the transmitted data or information. If so, method 400 can be exited. However, if the host has not wirelessly received an acknowledge packet from the peripheral, a determination can be made as to whether a predefined time period has expired since the host transmitted the data or information to the peripheral device. If not, the determination of whether the host has wirelessly received an acknowledge packet from the peripheral can be repeated. However, if it is determined that the predefined time period has expired, the host can wirelessly retransmit the data or information to the peripheral. In this manner, an encoded acknowledge signal can be enabled within a wireless communication protocol.

At operation 402 of FIG. 4, a determination as to whether a host (e.g., 102) has wirelessly received an encoded message (e.g., 216) that includes reconciliation data (e.g., 222) from a peripheral device (e.g., 104) via a wireless communication protocol (e.g., 106). If not, the process 400 can proceed to the beginning of operation 402 to repeat the determination. However, if the host has wirelessly received an encoded message that includes reconciliation data from the peripheral device via the wireless communication protocol at operation 402, the process 400 can proceed to operation 404. Note that operation 402 can be implemented in a wide variety of ways. For example, operation 402 can be implemented in any manner similar to that described herein, but is not limited to such.

At operation 404, a determination can be made as to whether the host is to wirelessly send data or information or a message (e.g., 234) to the peripheral device via the wireless communication protocol. If not, the process can proceed to operation 406. However, if it is determined that the host is to wirelessly send data or information or a message to the peripheral device at operation 404, the process 400 can proceed to operation 408. It is pointed out that operation 404 can be implemented in a wide variety of ways. For example, operation 404 can be implemented in any manner similar to that described herein, but is not limited to such.

At operation 406 of FIG. 4, the host can transmit wirelessly to the peripheral an acknowledge (ACK) packet (e.g., 212) that includes the received reconciliation data via the wireless communication protocol. It is noted that operation 406 can be implemented in a wide variety of ways. For example, operation 406 can be implemented in any manner similar to that described herein, but is not limited to such.

At operation 408, the host can transmit wirelessly to the peripheral via the wireless communication protocol an acknowledge packet (e.g., 224) that includes the received reconciliation data (e.g., 228) changed in predetermined way. Note operation 408 can be implemented in a wide variety of ways. For example, operation 408 can be implemented in any manner similar to that described herein, but is not limited to such.

At operation 410 of FIG. 4, the host can transmit wirelessly the data or information or message (e.g., 230) to the peripheral via the wireless communication protocol. It is pointed out that that operation 410 can be implemented in a wide variety of ways. For example, operation 410 can be implemented in any manner similar to that described herein, but is not limited to such.

At operation 412, a determination can be made as to whether the host has wirelessly received an acknowledge packet (e.g., 238) from the peripheral via the wireless communication protocol that corresponds to the transmitted data or information. If so, process 400 can be exited. However, if the host has not wirelessly received an acknowledge packet from the peripheral at operation 412, the process 400 can proceed to operation 414. It is noted that operation 412 can be implemented in a wide variety of ways. For example, operation 412 can be implemented in any manner similar to that described herein, but is not limited to such.

At operation 414 of FIG. 4, a determination can be made as to whether a predefined time period has expired since the host wirelessly transmitted the data or information or message to the peripheral device. If not, the process 400 can proceed to operation 412. However, if it is determined that the predefined time period has expired at operation 414, the process 400 can proceed to operation 410 so that the host can wirelessly retransmit the data or information or message. Note that operation 414 can be implemented in a wide variety of ways. For example, operation 414 can be implemented in any manner similar to that described herein, but is not limited to such.

Figure 5:
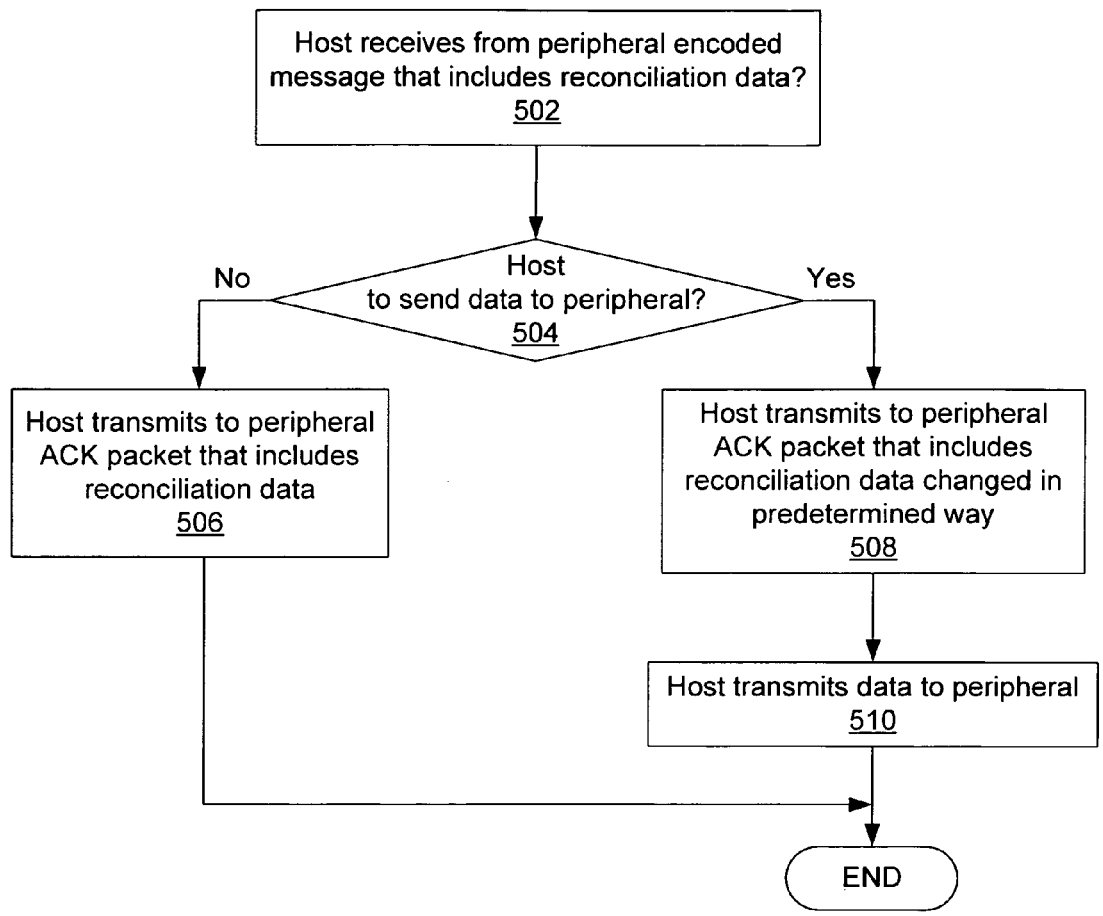
FIG. 5 is a flow diagram of yet another exemplary method in accordance with various embodiments of the invention.

FIG. 5 is a flow diagram of a method 500 in accordance with various embodiments of the invention for enabling an encoded acknowledge signal within a wireless communication protocol. Method 500 includes exemplary processes of various embodiments of the invention which can be carried out by a processor(s) and/or electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in or be stored by any type of computing device readable medium. Although specific operations are disclosed in method 500, such operations are exemplary. Method 500 may not include all of the operations illustrated by FIG. 5. Also, method 500 may include various other operations and/or variations of the operations shown by FIG. 5. Likewise, the sequence of the operations of method 500 can be modified. It is noted that the operations of method 500 can be performed by software, by firmware, by electronic hardware, by electrical hardware, or by any combination thereof.

Specifically, method 500 can include a host that can wirelessly receive an encoded message that includes reconciliation data from a peripheral device via a wireless communication protocol. A determination can be made as to whether the host is to wirelessly send data or information or a message to the peripheral device via the wireless communication protocol. If not, the host can transmit wirelessly to the peripheral an acknowledge (ACK) packet that includes the received reconciliation data via the wireless communication protocol. However, if it is determined that the host is to wirelessly send data or information or a message to the peripheral device, the host can transmit wirelessly to the peripheral via the wireless communication protocol an acknowledge packet that includes the received reconciliation data changed in predetermined way. The host can transmit wirelessly the data or information or message to the peripheral via the wireless communication protocol. In this manner, an encoded acknowledge signal can be enabled within a wireless communication protocol.

At operation 502 of FIG. 5, a host (e.g., 102) can wirelessly receive an encoded message (e.g., 204 or 216) that includes reconciliation data (e.g., 210 or 222) from a peripheral device (e.g., 104) via a wireless communication protocol (e.g., 106). It is noted that operation 502 can be implemented in a wide variety of ways. For example, operation 502 can be implemented in any manner similar to that described herein, but is not limited to such.

At operation 504, a determination can be made as to whether the host is to wirelessly send data or information or a message (e.g., 234) to the peripheral device via the wireless communication protocol. If not, the process can proceed to operation 506. However, if it is determined that the host is to wirelessly send data or information or a message to the peripheral device at operation 504, the process 500 can proceed to operation 508. It is pointed out that operation 504 can be implemented in a wide variety of ways. For example, operation 504 can be implemented in any manner similar to that described herein, but is not limited to such.

At operation 506 of FIG. 5, the host can transmit wirelessly to the peripheral an acknowledge (ACK) packet (e.g., 212) that includes the received reconciliation data (e.g., 210) via the wireless communication protocol. Note that the operation 506 can be implemented in a wide variety of ways. For example, operation 506 can be implemented in any manner similar to that described herein, but is not limited to such.

At operation 508, the host can transmit wirelessly to the peripheral via the wireless communication protocol an acknowledge packet (e.g., 224) that includes the received reconciliation data (e.g., 228) changed in predetermined way. It is pointed out that the operation 508 can be implemented in a wide variety of ways. For example, operation 508 can be implemented in any manner similar to that described herein, but is not limited to such.

At operation 510 of FIG. 5, the host can transmit wirelessly the data or information or message (e.g., 230 or 234) to the peripheral via the wireless communication protocol. It is noted that that the operation 510 can be implemented in a wide variety of ways. For example, operation 510 can be implemented in any manner similar to that described herein, but is not limited to such. At the completion of operation 510, process 500 can be exited.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A method comprising:
    wirelessly transmitting an encoded message from a peripheral device to a host system, the encoded message comprising first reconciliation data, wherein the first reconciliation data is a multi-bit cyclic redundancy check (CRC) data;
    wirelessly receiving at the peripheral device an acknowledgement message from the host system, the acknowledgement message in response to the encoded message and including second reconciliation data, wherein the second reconciliation data is a multi-bit cyclic redundancy check (CRC) data;

determining at the peripheral device whether the host system has information to transmit to the peripheral device through determining whether the second reconciliation data of the acknowledgement message received at the peripheral device is the first reconciliation data modified in a predetermined way, wherein the first reconciliation data modified in the predetermined way includes the first reconciliation data modified through an inversion operation; and determining a mode of the peripheral device based on the determination of whether the host has information to transmit to the peripheral device.

2. The method of claim 1, further comprising changing the mode of the peripheral device to a first mode when the determination of whether the second reconciliation data is the first reconciliation data modified in the predetermined way indicates that the first and the second reconciliation data have not changed with respect to each other.

3. The method of claim 2, wherein the changing to the first mode comprises the peripheral device entering one of a sleep mode or low power mode.

4. The method of claim 1, further comprising changing the mode of the peripheral device to a second mode when the determination of whether the second reconciliation data is the first reconciliation data modified in the predetermined way indicates that the first and the second reconciliation data have changed with respect to each other.

5. The method of claim 4, wherein the second mode includes remaining in a receive mode for a period of time to allow for receiving the information from the host system.

6. The method of claim 5, comprising entering another mode if the period of time to allow for receiving the information from the host system has exceeded a predefined period of time.

7. The method of claim 5, comprising sending an acknowledgement packet to the host system after receiving the information from the host system.

8. The method of claim 1, wherein prior to the wirelessly transmitting of the encoded message, generating the encoded message to include cyclic redundancy check (CRC) data as the reconciliation data.

9. A system comprising:
a host system; and
a peripheral device configured to wirelessly transmit an encoded message that comprises first reconciliation data to the host system,
the host system comprising a processor configured to:
invert the first reconciliation data if the host system has further information to transmit to the peripheral device; and
wirelessly transmit to the peripheral device, in response to the encoded message, an acknowledge packet that corresponds to the encoded message, the acknowledge packet comprising second reconciliation data, and
the peripheral device further configured to make a determination whether the host system has further information to transmit to the peripheral device through determining whether the second reconciliation data includes inverted first reconciliation data, the peripheral device comprising a first mode when the second reconciliation data does not include the inverted first reconciliation data and the peripheral device comprising a second mode when the second reconciliation data does include the inverted first reconciliation data.

10. The system of claim 9, wherein the peripheral device is selected from the group consisting of a keyboard, a remote control, and a computer mouse.

11. The system of claim 9, wherein the host system is selected from the group consisting of a computer system, a set-top box, and a television.

12. The system of claim 9, wherein the host system is configured to transmit to the peripheral device, subsequent to transmitting the second reconciliation data, a further encoded message comprising reconciliation data and the further information.

13. The system of claim 12, wherein the peripheral device is configured to enter the first mode after a predefined time period has expired without the peripheral device having received the further encoded message.

14. The system of claim 9, wherein the peripheral device and the host system are configured to transmit wirelessly either by infrared transmission or by radio frequency transmission.

15. A method comprising:
receiving by a host device an encoded message that comprises reconciliation data, the encoded message received through wireless communication with a peripheral device;
responsive to receiving the encoded message and using a processor and instructions of the host device:
determining whether to transmit to the peripheral device, data that is unrelated to the encoded message; and
when it is determined to transmit the data that is unrelated to the encoded message, inverting the reconciliation data of the encoded message, and transmitting wirelessly to the peripheral device, an acknowledge packet corresponding to the encoded message, the acknowledge packet including inverted reconciliation data, the inverted reconciliation data to indicate to the peripheral device that the host device will subsequently transmit to the peripheral device a packet including the data that is unrelated to the encoded message, and cause the peripheral device to operate in a receive mode for a period.

16. The method of claim 15, wherein the peripheral device is selected from the group consisting of a keyboard, a remote control, and a computer mouse.

17. The method of claim 15, further comprising: when it is determined not to transmit data that is unrelated to the encoded message, the processor implements instructions to transmit wirelessly to the peripheral device, an acknowledge packet corresponding to the encoded message and including the reconciliation data unchanged to cause the peripheral device to enter a low power mode.

* * * * *